(12) United States Patent
Naegle

(10) Patent No.: US 7,013,403 B2
(45) Date of Patent: Mar. 14, 2006

(54) SYNTHESIZING A PIXEL CLOCK WITH EXTREMELY CLOSE CHANNEL SPACING

(75) Inventor: Nathaniel David Naegle, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 569 days.

(21) Appl. No.: 10/199,473

(22) Filed: Jul. 19, 2002

(65) Prior Publication Data

US 2004/0012577 A1 Jan. 22, 2004

(51) Int. Cl.
    *G06F 1/04* (2006.01)
(52) U.S. Cl. ........................ 713/500; 713/400
(58) Field of Classification Search ............. 713/400, 713/500, 501, 503, 600
    See application file for complete search history.

(56) References Cited

U.S. PATENT DOCUMENTS

| | | | |
|---|---|---|---|
| 3,769,602 A | 10/1973 | Griswold | |
| 4,030,045 A | 6/1977 | Clark | |
| 5,072,195 A | 12/1991 | Graham et al. | |
| 5,428,361 A | 6/1995 | Hightower et al. | |
| 5,455,627 A | 10/1995 | Eitzmann et al. | |
| 5,734,970 A | 3/1998 | Saito | |
| 5,739,727 A | 4/1998 | Lofter et al. | |
| 5,789,952 A | 8/1998 | Yap et al. | |
| 5,943,382 A * | 8/1999 | Li et al. .................... | 375/376 |
| 6,078,634 A | 6/2000 | Bosshart | |
| 6,188,258 B1 * | 2/2001 | Nakatani .................... | 327/157 |
| 6,441,658 B1 * | 8/2002 | Taraci et al. ................ | 327/147 |
| 6,469,553 B1 * | 10/2002 | Sung et al. .................. | 327/156 |
| 6,636,575 B1 * | 10/2003 | Ott ........................... | 375/376 |
| 6,703,876 B1 * | 3/2004 | Fujiwara et al. ............ | 327/156 |
| 2002/0122515 A1 * | 9/2002 | Bodenschatz ............... | 375/354 |

OTHER PUBLICATIONS

Phase-Locked Loop Definition on WhatIS.com, Jul. 12, 2002, 2 pages.
MGA (Over)clocking paper from http://grafi.ii.pw.edu.pl/gbm/matrox/mgaclock.html, Jul. 9, 2002, pp. 1-8.
Stetson, P. Sean, Presentation on PUMA website: http//www.eecs.umich.edu/UmichMP/circ-clocklogic.html, Jul. 7, 2002, pp. 1-24.
Philips, Application Note AN177 "An Overview of the Phase-Locked Loop (PLL)", Dec. 1988, pp. 1-6.
Integrated Circuit Systems, Inc., Preliminary Product Review ICS1524 "High-Performance Phase Controlled Clock Generator", Dec. 6, 2001, pp. 1-9.

* cited by examiner

*Primary Examiner*—Dennis M. Butler
(74) *Attorney, Agent, or Firm*—Meyertons Hood Kivlin Kowert & Goetzel, P.C.; Jeffrey C. Hood; Martin R. Wojcik

(57) ABSTRACT

A graphic system may include a pixel synthesizing device that uses two or more phase-locked loops (PLL's) in tandem in order to achieve a better M/N ratio. The two PLL's connected in tandem have an effective M/N ratio of (M1*M2)/(N1*N2). The pixel synthesizing device is operable to synthesize free-running (non-genlocked, or sync-master) pixel clock frequencies using a much greater variety of M and N. As a result, greater precision in specification of the pixel clock frequency is achieved, yielding greater precision in a frame rate of a particular video format. As a result, the allowable channel spacing is greatly increased, and the graphic system can select from a wide range of ultradense spaced pixel clocks.

20 Claims, 3 Drawing Sheets

SYNTHESIZING A PIXEL CLOCK WITH EXTREMELY CLOSE CHANNEL SPACING

BACKGROUND OF THE INVENTION

Description of the Related Art

Pixel clock frequency plays an integral role in video format design, as it provides timing for video signals. Typically, for video equipment capable of producing several different video formats, pixel clock synthesis is done using a phase-locked loop (PLL) where a divide by N counter is inserted in the timebase reference path, and a divide by M counter (multiplier) is inserted in the PLL feedback path to form a classic M/N PLL synthesizer. There are typically limitations on the magnitude of the M and N numerical values, in order to keep the PLL locked and the clock jitter-free.

In classical M/N PLL synthesizers, the input frequency reference, divided by the maximum value of N, determines the minimum step in frequency between two settings of the PLL. This is often referred to as channel spacing.

FIG. 1

Most PLL circuits for simple $$\frac{M}{N}$$

PLL architecture to achieve channel spacing. FIG. 1 illustrates a conventional phase lock loop (PLL) 100, in which phase locking of two signals, an external signal 116 and a local signal 110, takes place. Phase lock loop 100 includes a phase difference detector 102, a loop filter 104, a clock generator 106, which may be a Voltage controlled Oscillator (VCO). The PLL also includes a predivider 100 and a feedback frequency divider 108, which actually acts as a frequency multiplier. A PLL may also have a clock generator, such as a crystal (not shown).

Phase difference detector 102 determines the phase difference between local signal 110 and an external signal 116. External signal 116 may be received from an external signal source. If the value of actual phase difference signal is equal to zero, local signal 110 is locked in phase with external signal. If the value of actual phase difference signal is not equal to zero, local signal 110 is not locked in phase with external signal, and the frequency of local signal 110 needs to be corrected in order to affect the phase of local signal 110 relative to external signal 116. Clock generator 108, which may be a voltage controlled oscillator (VCO), creates a local signal 110.

This frequency, in conjunction with an m-over-n frequency multiply/divide internal to clock generator 108, sets the overall target frequency of local clock signal 110. Clock input frequency division is accomplished by means of a frequency predivider 100, also referred to as the N internal divider. The Frequency Divider, also referred to as the M internal feedback multiplier 110, which connects to the feedback loop of the PLL, multiplies the incoming external clock. In the PLL closed loop, the effect of the frequency divider is to multiply the PLL input frequency by its Division Factor.

It is desirable for the channel spacing to be very small, in order to accurately control the video frame rate. However, the limited range of M, N values in pixel clock synthesizers has not allowed channel spacing to be small as would be needed to achieve accurate control of video frame rate.

SUMMARY

A graphic system may include a pixel synthesizing device which uses two or more phase-locked loops (PLL's) in tandem in order to achieve a better $$\frac{M}{N}$$

ratio. The two PLL's connected in tandem have an effective $$\frac{M}{N}$$

ratio of $$\frac{M_1 \times M_2}{N_1 \times N_2}.$$

The tandem PLL arrangement allows the first PLL to serve as the timebase for the second PLL. A first PLL may be operable to receive the local timebase signal and produce an intermediate signal of an intermediate frequency. A second PLL may be operable to receive the intermediate signal and operate on the intermediate signal to produce a final signal of a final frequency. The local timebase may have a crystal-generated frequency of 13.5 MHz.

If the first PLL is programmed to free-run, then the second PLL has a much richer set of reference frequencies than if it simply used its own 13.5 MHz oscillator. The pixel synthesizing device is operable to synthesize free-running (non-genlocked, or sync-master) pixel clock frequencies using a much greater variety of M and N. In effect, greater precision in specification of the pixel clock frequency is achieved, yielding greater precision in a frame rate of a particular video format. As a result, the allowable channel spacing is greatly increased, and the graphics system is operable to provide a larger set of pixel clock frequencies for various video formats.

The final frequency of the final signal of the final frequency, also referred to as a pixel clock signal is:

$$F_{Final} = \frac{F_1 \times M_1 \times M_2}{N_1 \times N_2}$$

where F1 is the frequency of the local timebase;
where M1 is the value of the internal frequency multiplier of the first phase-locked loop circuit;
where M2 is the value of the internal frequency multiplier of the second phase-locked loop circuit;
where N1 is the value of the internal frequency divider of the first phase-locked loop circuit; and
where N2 is the value of the internal frequency divider of the second phase-locked loop circuit.

DETAILED DESCRIPTION OF EMBODIMENTS OF THE INVENTION

U.S. patent application Ser. No. 09/894,617, filed on Jun. 27, 2001, entitled "Flexible Video Architecture for Generating Video Streams", invented by Michael F. Deering and Nathaniel D. Naegle, is hereby incorporated by reference in its entirety.

U.S. Pat. No. 6,417,861 filed Jul. 17, 1999, entitled "Graphics system with programmable sample positions", invented by Michael F. Deering and Nathaniel D. Naegle, is hereby incorporated by reference in its entirety.

Various embodiments of a pixel synthesizing device are described below. Various embodiments of the pixel synthesizing device may be included in the various embodiments described in the U.S. patent application Ser. No. 09/894,617. Various embodiments of the pixel synthesizing device may be included in the various embodiments described in the U.S. patent application Ser. No. 09/894,617.

Figure 1:
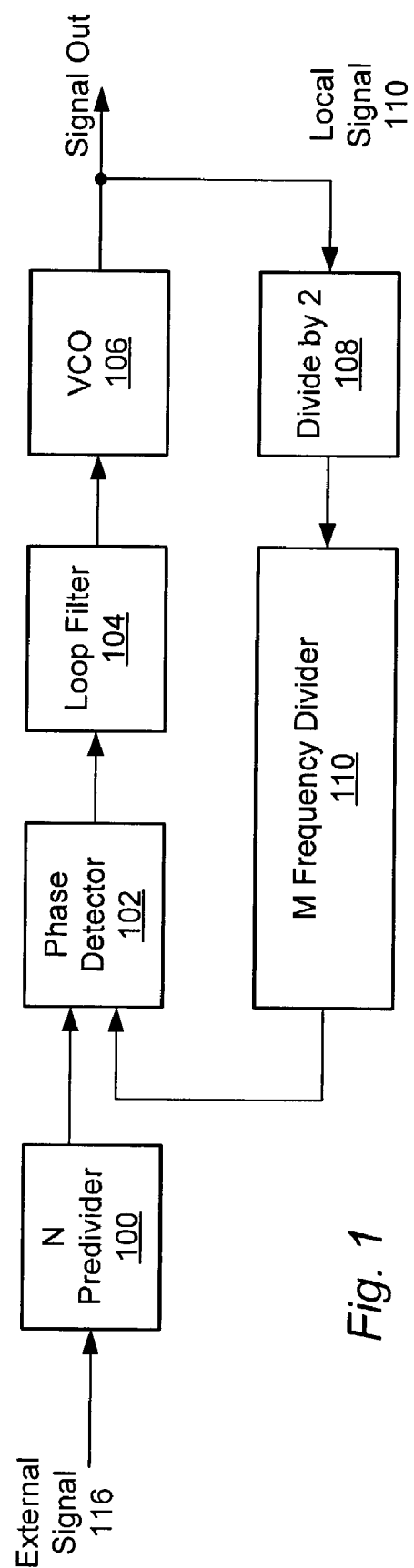
FIG. 1 (Related Art)—Basic block diagram of a PLL.
Figure 2:
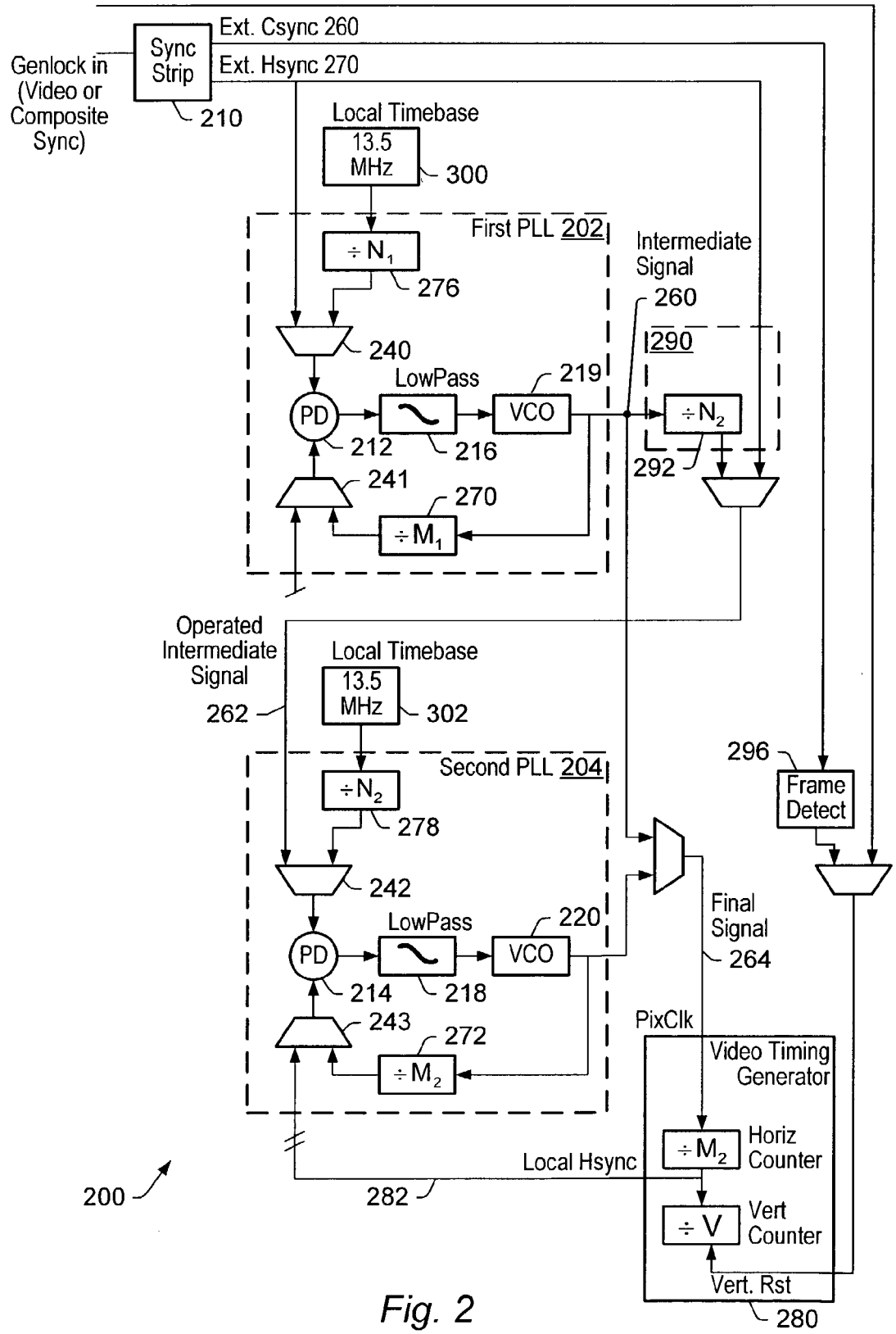
FIG. 2—Basic block diagram of a clock synthesizing device, according to one embodiment.

FIG. 2—Basic Block Diagram of a Pixel Synthesizing Device

FIG. 2 is a basic block diagram of a pixel synthesizing device, according to one embodiment.

The pixel synthesizing device 200 is operable to synthesize free-running (non-genlocked, or sync-master) pixel clock frequencies using a much greater variety of M and N. The pixel synthesizing device 200 may include a first phase-locked loop circuit 202, also referred to herein as a first PLL, and a second phase-locked loop circuit 204, also referred to herein as a second PLL, connected in tandem. The pixel synthesizing device 200 may also include a local timebase signal of a first frequency 300 and/or 302 (both may be generated using the same crystal, not shown). The first PLL 202 may be coupled to the local timebase signal 200, and the second PLL 204 may be using the output of the first PLL 202 as its timebase signal.

The first PLL 202 may be operable to receive the local timebase signal 300 and produce an intermediate signal of an intermediate frequency. The second PLL 204 may be operable to receive the intermediate signal 260 and operate on the intermediate signal 260 to produce a final signal 264 of a final frequency. In one embodiment, the local timebase may have a frequency of 13.5 MHz, and is generated by a crystal (not shown). In other embodiments, other values for the local timebase frequency are possible.

The first phase-locked loop circuit 202 is operable to divide the frequency of the local timebase signal 300 by a first division factor N1 276. The first phase-locked loop circuit 202 is further operable to multiply the frequency of the local timebase signal by a first multiplication factor M1 270 to produce the intermediate signal of the intermediate frequency 260. The first phase-locked loop may use an internal frequency divider N1 276. In one embodiment, a multiplexer 240 is operable to select the local timebase signal 300 divided by the N1 frequency divider 276 instead of an external HSync input 270. The first phase-locked loop 202 may also use an internal frequency multiplier M1 270. In one embodiment, a multiplexer 241 is operable to select the internal frequency multiplier M1 270 in the feedback loop instead of an external input signal.

The second phase-locked loop circuit 204 may be operable to divide the frequency of the intermediate signal by a second division factor N2. In one embodiment, a multiplexer 242 may be operable to select the operated intermediate signal 262 as an input to the second PLL 204 instead of the local timebase 302. In effect, the first PLL 202 is providing a timebase signal to the second PLL 204. The second phase-locked loop circuit 204 is further operable to multiply the frequency of the intermediate signal by a second multiplication factor M2 to produce the final signal 264 of a final frequency. In one embodiment, a multiplexer 241 is operable to select the internal frequency multiplier M2 272 in the feedback loop instead of an external input signal from a Video Timing Generator 280.

In one embodiment, the second phase-locked loop circuit includes a logic circuit 290. The logic circuit 290 is operable to divide the frequency of the intermediate signal by a second division factor N2 292 prior to passing the intermediate signal to the remainder of the second phase-locked loop circuit 204. The N2 divider 292 implemented by the logic circuit 290 may be operable to function analogously to an internal frequency divider 278 of the second phase-locked loop circuit 204, which may not be utilized.

The final frequency $F_{Final}$ of the final signal 264 is equal to:

$$F_{Final} = \frac{F_1 \times M_1 \times M_2}{N_1 \times N_2}$$

where F1 is the frequency of the local timebase;

where M1 is the value of the internal frequency multiplier of the first phase-locked loop circuit;

where M2 is the value of the internal frequency multiplier of the second phase-locked loop circuit;

where N1 is the value of the internal frequency divider of the first phase-locked loop circuit; and where N2 is the value of the internal frequency divider of the second phase-locked loop circuit.

Other embodiments using different internal PLL structures and/or different techniques for routing the signals through the PLL may be contemplated.

Figure 3:
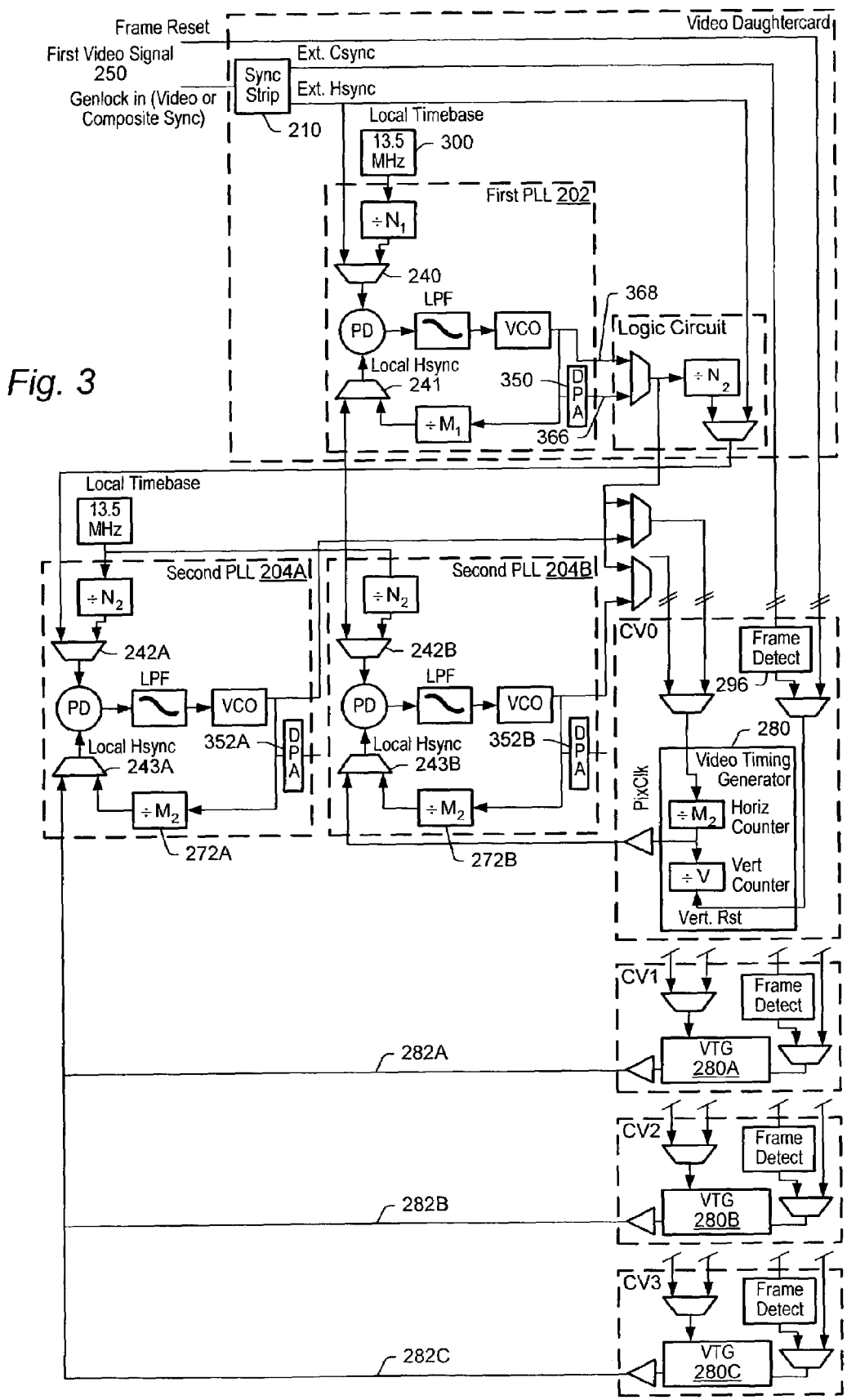
FIG. 3—Detailed block diagram of a clock synthesizing device, according to one embodiment.

FIG. 3—Detailed Block Diagram of a Pixel Synthesizing Device

FIG. 3 is a detailed block diagram of a pixel synthesizing device, according to one embodiment. The tandem PLL arrangement allows the first PLL 202 to serve as the timebase for the second PLL 204A and/or 204B. If the first PLL 202 is programmed to free-run, then the second PLL 204A and/or 204B has a much richer set of reference frequencies than if it simply used its own 13.5 MHz oscillator 302.

In one embodiment, there may be a plurality of VTG's 280, 280A, 280B, and 280C. In one embodiment, there may be one or more second PLL's 204A and 204B. The N2 divider in the logic circuit 290 can be programmed to produce the Hsync signal produced by the Video Timing Generator (VTG) 280 for interlaced video formats. This signal may be passed to the one or more second PLL's 204A and 204B, which can lock and produce the pixel clock. The N2 divider 292 in the logic circuit 290 may be able to be synchronously reset by the incoming Hsync signal, such that the Hsync signal produced by the N2 divider 292 has zero phase with the first video signal 250. This allows the one or more second PLL's 204A and 204B to lock with the Hsync signal from the VTG 280, with either Zero or Hperiod/2 phase with respect to the incoming video timing. The VTG Csync signals can be passed to the logic circuit 290 for a determination of synchronization phase. If the synchronization phase is Hperiod/2, the logic circuit 290 N2 divider can be skip clock pulses from the first PLL 202 until the horizontal phase of the VTG 280 is zero with respect to the incoming video timing from the first video signal 250.

In one embodiment, an ability to adjust VTG horizontal phase by means of the N2 divider 292 may be also under user control. System software can adjust the phase of the Hsync produced by the N2 divider 292 to include a selected horizontal phase with respect to the incoming Master video timing from the first video signal 250. In one embodiment, interlaced, progressive, and/or and stereo video formats can be phase adjusted by programming the logic circuit 290 N2 divider to produce a pure Hsync signal, instead of 2×Hsync for interlace formats. The Hsync signal can then be sent to the one or more second PLL's 204A and 204B.

In one embodiment, each PLL may contain a sub-pixel, Dynamic Phase Adjustment (DPA) 350, 352A, and 352B. The DPA clock output may be used on the first PLL 202. The first PLL 202 may have two PECL clock outputs 366 and 368, the first PECL output 366 containing the DPA function, and the second PECL 368 without. The DPA adjustment may be used for pixel clocks below 160 MHz, and the first PECL output 366 should be used. For higher frequency pixel clocks, sub-pixel phase adjustment is not usually necessary, and the non-DPA PECL clock output 368 should be used to ensure good duty-cycle on the PixClk. This is critical for PixClks above 200 MHz. Both of these PECL clock outputs 366 and 368 may be propagated to the logic circuit 290, which may be operable to select one of these clocks.

Selecting the DPA clock output and using the pixel phase adjust feature of the logic circuit 290 N2 divider 292 may give the ability to adjust pixel phase of the Hsync signal sent to the one or more second PLL's 204A and 204B. With the VTG Hsync signal used as the feedback divider 282, 282A, 282B, and 282C for the one or more second PLL's 204A and 204B, the VTG 280 may maintain zero phase with respect to the Hsync signal from the logic circuit 290. Thus the VTG 280 may inherit whatever horizontal phase the N2 divider has with respect to the Master's video timing. Therefore the DPA outputs of the one or more second PLL's 204A and 204B may be unneeded and unused. The VTG Frame Detector may implement vertical phase adjustments. As a result, the video synchronization device may have complete horizontal and subpixel genlock phase adjustment.

The basic formula for free-running synthesis with the PLL is as follows:

$$PixClk' = \frac{M}{N} \times 13.5 \text{ MHz}$$

In one embodiment, a formula for free-running pixel clock synthesis for two PLL's running in tandem is:

$$PixClk' = \frac{M_1 \times M_2}{N_1 \times N_2} \times 13.5 \text{ MHz} = \frac{M'}{N'} \times 13.5 \text{ MHz}$$

In the equation above, the subscripts on the variables refer to the order in which they are applied. Each of the variables N1, M1, N2, and M2 should be factored into product of prime factors, and all common factors in the numerator and denominator should be eliminated. Note that the circuit shown in FIGS. 2 and 3 allows both modes of synthesis (i.e., a single PLL, or two PLL's in tandem.) In one embodiment, the limitations on the tandem mode of operation may be as follows:

$3 \leq N1 \leq 129$ $8 \leq M1 \leq 4103$ $1 \leq N2 \leq 4095$ $8 \leq M2 \leq 4103$ From these first four constraints, we see that $64 \leq M' \leq 16834609$ $3 \leq N' \ 528255$ Since M' is the product of M1 and M2, prime numbers are disallowed for M'

Similarly, prime numbers are disallowed for N'

In one embodiment, other constraints may exists which arise from the limited range of the VCOs of the PLL's. This may restrict the ratios of M' and N'. Finally, a requirement that the loop bandwidth of the second PLL 204 be wider than the loop bandwidth of the first PLL 202 places restrictions on the relative values of M2 relative to M1, and N2 relative to N1.

Despite these restrictions, the greater range of M' and N' allows more values of pixel clock frequencies within the existing VCO limits.

EXAMPLE

To illustrate channel spacing concept, an example of a VESA standard VGA of 640×480 @ 60 Hz will be used. The desired clock frequency is 25.175 MHz, but in many single PLL implementations the closest clock frequency is 25.125 MHz. This gives a frame rate that is not the desired 59.940 Hz (the NTSC field rate), but rather 59.821 Hz. This discrepancy arose because a single M/N PLL synthesizer operating at 13.5 MHz, with M, N subject to the accuracy of an ICS1524 PLL implementation, cannot produce 25.175 MHz.

Using the tandem synthesizer and the equations listed above the values of M' and N' may be deduced, with M'=3021 and N'=1620. These values can be split into prime factors:

M'=3×19×53

N'=2×2×3×3×3×3×5.

Composite M1, M2, N1, N2 can then be chosen by combining these factors:

M1=53

N1=27 (3×3×3×5)

M2=57 (3×19),

N2=60 (2×2×3×5).

The choices may be governed by the following constraint:

$$\frac{M2}{N2}$$

ratio should be near unity, so that the second PLL 204A and/or 204B can track the first PLL 202 well. The ICS1524 PLL specification specifies a range of frequencies at the Hsync input between 8 KHz and 10 MHz. With this choice of parameters, the Hsync input frequency as computed by the first PLL 202 and the logic circuit 290 has a value of:

$$13.5 \text{ MHz} \times \frac{53}{27 \times 60} = 441.666 \text{ KHz}$$

at the input of the second PLL 204 and/or 204B, and the output frequency is perfectly synthesized:

441.666 KHz×57=25.175 MHz.

Jitter

To limit Jitter, the feedback divider, also referred to as the internal multiplier, M1 270 of the first PLL 202 should have a larger value than that of the second PLL 204 feedback divider (M2, which may be implemented by the VTG 280). In the example above, M1 was programmed to 157, and M2 to 40. This allows the second PLL 204 to respond faster than the first PLL 202, essentially tracking the first PLL's 202 transients and deviations about its nominal frequency.

In one embodiment, each PLL may include a Phase/Frequency Detector and a corresponding Phase/Frequency Detector Gain register (PFDGain), which may control the closed-loop bandwidth of each PLL. The PFDGain value indicates how much current will be issued by the phase detector in response to a given phase error. The magnitude of this current controls the change in VCO control voltage in response to a phase or frequency error measured by the Phase/Frequency Detector. Intuitively, a smaller value of PFDGain will cause the PLL to take longer to eliminate a phase or frequency difference at the inputs to the PFD. Conversely, a too-large PFDGain value may cause the loop to over-correct for such a phase difference, resulting in ringing in the loop response. Typically the value programmed into the PFDGain register of the second PLL 204 should be equal to or greater than the value programmed into the PFDGain register of the first PLL 202. This may result in a faster response by the second PLL 204 than the first PLL 202, in effect allowing the first PLL 202 to dominate the overall loop characteristics.

Other embodiments using different internal PLL structures and/or different techniques for routing the signals through the PLL may be contemplated.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A device for synthesizing a pixel clock signal with improved precision in specification of the signal frequency, the device comprising:
    a local timebase signal of a first frequency;
    a first phase-locked loop circuit operable to receive the local timebase signal and operate on the local timebase signal to produce an intermediate signal of an intermediate frequency; and
    a second phase-locked loop circuit operable to receive the intermediate signal and operate on the intermediate signal to produce a final signal of a final frequency;
    wherein internal multiplier and divisor factors for the second phase-locked loop circuit are selected so that the ratio of the multiplier factor divided by the divisor factor is near unity.

2. The device of claim 1, wherein the first frequency of the local timebase signal is substantially equal to 13.5 MHz.

3. The device of claim 1,
    wherein the first phase-locked loop circuit is operable to multiply the frequency of the local timebase signal by a first multiplication factor; and
    wherein the first phase-locked loop circuit is further operable to divide the frequency of the local timebase signal by a first division factor to produce the intermediate signal of the intermediate frequency.

4. The device of claim 1,
    wherein the second phase-locked loop circuit is operable to divide the frequency of the intermediate signal by a second division factor; and
    wherein the second phase-locked loop circuit is further operable to multiply the frequency of the intermediate signal by a second multiplication factor to produce the final signal of a final frequency.

5. The device of claim 4, wherein the second phase-locked loop circuit comprises a logic circuit; wherein the logic circuit is operable to divide the frequency of the intermediate signal by a second division factor prior to passing the divided intermediate signal to the remainder of the second phase-locked loop circuit.

6. The device of claim 5, wherein the logic circuit is operable to function analogously to an internal frequency divider of the second phase-locked loop circuit.

7. The device of claim 6, wherein the internal frequency divider of the second phase-locked loop circuit is not utilized.

8. The device of claim 1, wherein the first phase-locked loop is operable to use an internal frequency multiplier.

9. The device of claim 1, wherein the second phase-locked loop is operable to use an internal frequency multiplier.

10. The device of claim 1, wherein the final frequency of the final signal is substantially equal to:

$$F_{Final} = \frac{F_1 \times M_1 \times M_2}{N_1 \times N_2};$$

wherein F1 is the frequency of the local timebase;
    wherein M1 is the value of an internal frequency multiplier of the first phase-locked loop circuit;
    wherein M2 is the value of an internal frequency multiplier of the second phase-locked loop circuit;
    wherein N1 is the value of an internal frequency divider of the first phase-locked loop circuit;
    wherein N2 is the value of an internal frequency divider of the second phase-locked loop circuit; and
    wherein $F_{Final}$ is the final frequency of the final signal.

11. The device of claim 10, wherein one or more of the M1, M2, N1, and N2 values can be modified to vary the final frequency of the final signal by a small amount.

12. The device of claim 1, wherein each phase-locked loop circuit further comprises a phase detector and a gain register, wherein the value stored in the gain register of the second phase-locked loop circuit is greater than or equal to the value stored in the gain register of the first phase-locked loop circuit to allow the first phase-locked loop circuit to dominate the overall loop characteristics.

13. A method to synthesize an ultradense pixel clock signal, the method comprising:
    generating a local timebase signal of a first frequency;
    a first phase-locked loop circuit receiving the local timebase signal and operating on the local timebase signal to produce an intermediate signal of an intermediate frequency; and a second phase-locked loop circuit receiving the intermediate signal and operating on the intermediate signal to produce a final signal of a final frequency;

wherein internal multiplier and divisor factors for each phase-locked loop circuit are selected so that the final frequency divided by the intermediate frequency is near unity, and wherein the final signal is operable to serve as a pixel clock signal.

14. The method of claim 13, wherein the final frequency of the final signal is substantially equal to:

$$F_{Final} = \frac{F_1 \times M_1 \times M_2}{N_1 \times N_2};$$

wherein F1 is the frequency of the local timebase;

wherein M1 is the value of an internal frequency multiplier of the first phase-locked loop circuit;

wherein M2 is the value of an internal frequency multiplier of the second phase-locked loop circuit;

wherein N1 is the value of an internal frequency divider of the first phase-locked loop circuit;

wherein N2 is the value of an internal frequency divider of the second phase-locked loop circuit; and wherein $F_{Final}$ is the final frequency of the final signal.

15. The method of claim 14, wherein one or more of the M1, M2, N1, and N2 values can be modified to vary the final frequency of the final signal by a small amount.

16. A graphics system, comprising:

one or more filtering units, wherein the one or more filtering units are operable to filter samples and thereby produce pixels, wherein each one of the one or more filtering units comprises one or more pixel synthesizing devices, wherein the one or more pixel synthesizing devices are operable to produce an ultradense pixel clock signal for the graphic system;

wherein each one of the one or more pixel synthesizing devices comprises:

a local timebase signal of a first frequency;

a first phase-locked loop circuit operable to receive the local timebase signal and operate on the local timebase signal to produce an intermediate signal of an intermediate frequency;

a second phase-locked loop circuit operable to receive the intermediate signal and operate on the intermediate signal to produce a final signal of a final frequency, wherein the second phase-locked loop circuit has a loop bandwidth wider than a loop bandwidth of the first phase-locked loop circuit.

17. The graphics system of claim 16, wherein the final frequency of the final signal is substantially equal to:

$$F_{Final} = \frac{F_1 \times M_1 \times M_2}{N_1 \times N_2};$$

wherein F1 is the frequency of the local timebase;

wherein M1 is the value of an internal frequency multiplier of the first phase-locked loop circuit;

wherein M2 is the value of an internal frequency multiplier of the second phase-locked loop circuit;

wherein N1 is the value of an internal frequency divider of the first phase-locked loop circuit;

wherein N2 is the value of an internal frequency divider of the second phase-locked loop circuit; and wherein $F_{Final}$ is the final frequency of the final signal.

18. The graphics system of claim 17, wherein one or more of the M1, M2, N1, and N2 values can be modified to vary the final frequency of the final signal by a small amount.

19. The graphics system of claim 17, wherein M1 is selected to be greater than M2 to limit jitter.

20. The graphics system of claim 16, wherein each phase-locked loop circuit further comprises a phase detector and a gain register, wherein the value stored in the gain register of the second phase-locked loop circuit is greater than or equal to the value stored in the gain register of the first phase-locked loop circuit to allow the first phase-locked loop circuit to dominate the overall loop characteristics.

* * * * *